(12) United States Patent
Chao et al.

(10) Patent No.: US 8,770,791 B2
(45) Date of Patent: Jul. 8, 2014

(54) LIGHT BAR STRUCTURE AND DISPLAY DEVICE

(75) Inventors: Sheng-Chieh Chao, Taoyuan County (TW); Cheng-Sheng Chiang, Taipei County (TW); Po-Fu Kuo, Taipei (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 622 days.

(21) Appl. No.: 13/009,860

(22) Filed: Jan. 20, 2011

(65) Prior Publication Data

US 2012/0112990 A1    May 10, 2012

(30) Foreign Application Priority Data

Nov. 10, 2010  (TW) .............................. 99221778 U

(51) Int. Cl.
*F21S 4/00* (2006.01)
(52) U.S. Cl.
USPC ....................... 362/249.02; 362/231
(58) Field of Classification Search
USPC .............. 362/97.1, 311.01, 382, 231, 249.02
See application file for complete search history.

(56) References Cited

U.S. PATENT DOCUMENTS

2007/0247870 A1* 10/2007 Sakai et al. .................... 362/612
2007/0256453 A1* 11/2007 Barnes et al. .................. 65/17.3
2008/0106898 A1*  5/2008 Park et al. ...................... 362/235

FOREIGN PATENT DOCUMENTS

TW              505367         10/2002

* cited by examiner

*Primary Examiner* — Anne Hines
(74) *Attorney, Agent, or Firm* — Winston Hsu; Scott Margo

(57) ABSTRACT

A light bar structure includes a circuit board and a plurality of light emitting units. A plurality of holes is formed on the circuit board. Each light emitting unit includes a main body and a plurality of leads. The main body is disposed in one of the holes. The main body has a light emitting surface and a non-light emitting surface opposite to the light emitting surface. Each lead has a first connecting portion, a second connecting portion and an extending portion. The first connecting portion is connected to the non-light emitting surface. The extending portion is extended from the first connecting portion toward the light emitting surface. The second connecting portion is extended from the extending portion and connected to a surface of the circuit board.

8 Claims, 7 Drawing Sheets

LIGHT BAR STRUCTURE AND DISPLAY DEVICE

BACKGROUND OF THE INVENTION

1. Field of the Invention

The invention relates to a light bar structure and a display device and, more particularly, to a light bar structure and a display device capable of providing a uniform light field.

2. Description of the Prior Art

Since liquid crystal display (LCD) device has advantages of light weight, thin thickness, low power consumption and no radiation, it has been popularly applied to laptop computer, personal computer, television and so on. However, because an LCD panel of the LCD device cannot emit light by itself, a backlight module is needed to provide sufficient illumination for the LCD panel, so as to enable the LCD panel to display images.

Referring to FIG. 1, FIG. 1 is an exploded view illustrating an LCD device 1 of the prior art. As shown in FIG. 1, the LCD device 1 comprises an outer frame 10, a display panel 12, a backlight module 14 and a back cover 16. The display panel 12 is disposed on the backlight module 14. The display panel 12 has an active area 120. The backlight module 14 comprises a frame 20, an optical film assembly 22, a light guide plate 24, two light bar structures 26 and a reflective sheet 28. The optical film assembly 22 is disposed on the light guide plate 24. The reflective sheet 28 is disposed under the light guide plate 24. The two light bar structures 26 are disposed at opposite sides of the light guide plate 24 respectively. Each of the light bar structure 26 consists of a plurality of light emitting diodes 260 and a circuit board 262. Light emitted from the light emitting diodes 260 is projected out of the optical film assembly 22 via the light guide plate 24. The display panel 12 and the backlight module 14 are fixed within the outer frame 10 and the back cover 16, so as to assemble the LCD device 1.

Referring to FIG. 2, FIG. 2 is an enlarged view illustrating a partial area B shown in FIG. 1. As shown in FIG. 2, the light bar structure 26 comprises a plurality of light emitting diodes 260 and a circuit board 262. The light emitting diodes 260 are disposed on the circuit board 262. Each of the light emitting diodes 260 comprises a main body 2600 and a pair of leads 2602. Furthermore, the main body 2600 has a light emitting surface 2604 and the light emitting diode 260 emits light from the light emitting surface 2604. In general, each of the light emitting diodes 260 is fixed on the circuit board 262 by surface mount technology (SMT). Since the light emitting diodes 260 are disposed on the circuit board 262, a total thickness of each light bar structure 26 is equal to the sum of a thickness of the circuit board 262 and a height of each light emitting diode 260.

Referring to FIG. 3 along with FIG. 1, FIG. 3 is a partial top view illustrating the display device 12 and the light bar structure 26 shown in FIG. 1. As shown in FIG. 3, a distance A is between the light emitting surface 2604 of the light emitting diode 260 and an edge of the active area 120 of the display panel 12, and a span P is between two adjacent light emitting diodes 260. Light emitted from the light emitting surface 2604 of the light emitting diode 260 will form a fan-shaped light field. The larger the distance A is and the more uniform the fan-shaped light field spreads into the light guide plate 24. If the distance A between the light emitting diode 260 and the active area 120 is too small, a bright area will appear on the light emitting surface 2604 of the light emitting diode 260 and a dark area will appear between two adjacent light emitting diodes 260. Consequently, a hot spot phenomenon may occur at the edge of the active area 120. However, if the distance A increases due to the conventional light bar structure 26, the whole size of the backlight module 14 will increase correspondingly. On the other hand, another method for modifying the hot spot phenomenon is to increase the number of light emitting diodes 260 (i.e. to decrease the span P). However, if the number of light emitting diodes 260 increases, the production cost of the backlight module 14 will increase correspondingly.

SUMMARY OF THE INVENTION

Therefore, an objective of the invention is to provide a light bar structure and a display device capable of providing a uniform light field, so as to solve the aforesaid problem.

According to one embodiment of the invention, a light bar structure comprises a circuit board and a plurality of light emitting units. A plurality of holes is formed on the circuit board. Each of the light emitting units comprises a main body and a plurality of leads. The main body is disposed in one of the holes. The main body has a light emitting surface and a non-light emitting surface opposite to the light emitting surface. Each of the leads has a first connecting portion, a second connecting portion and an extending portion. The first connecting portion is connected to the non-light emitting surface, the extending portion is extended from the first connecting portion toward the light emitting surface, and the second connecting portion is extended from the extending portion and connected to a surface of the circuit board.

According to another embodiment of the invention, a display device comprises a display panel and a backlight module. The backlight module comprises a frame, a light guide plate and a light bar structure. The display panel is disposed on the frame. The light guide plate is disposed in the frame. The light bar structure is disposed in the frame and located at one side of the light guide plate. The structural design of the light bar structure is mentioned in the above.

As mentioned in the above, the main body of the light emitting unit of the invention is sunk into the corresponding hole of the circuit board due to the structural design of the leads, such that the height of the light bar structure is reduced. Furthermore, since the main body of the light emitting unit is sunk into the corresponding hole of the circuit board, the distance between the light emitting surface of the main body and an active area of the display panel can be increased, so as to prevent the hot spot phenomenon from occurring at an edge of the active area.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
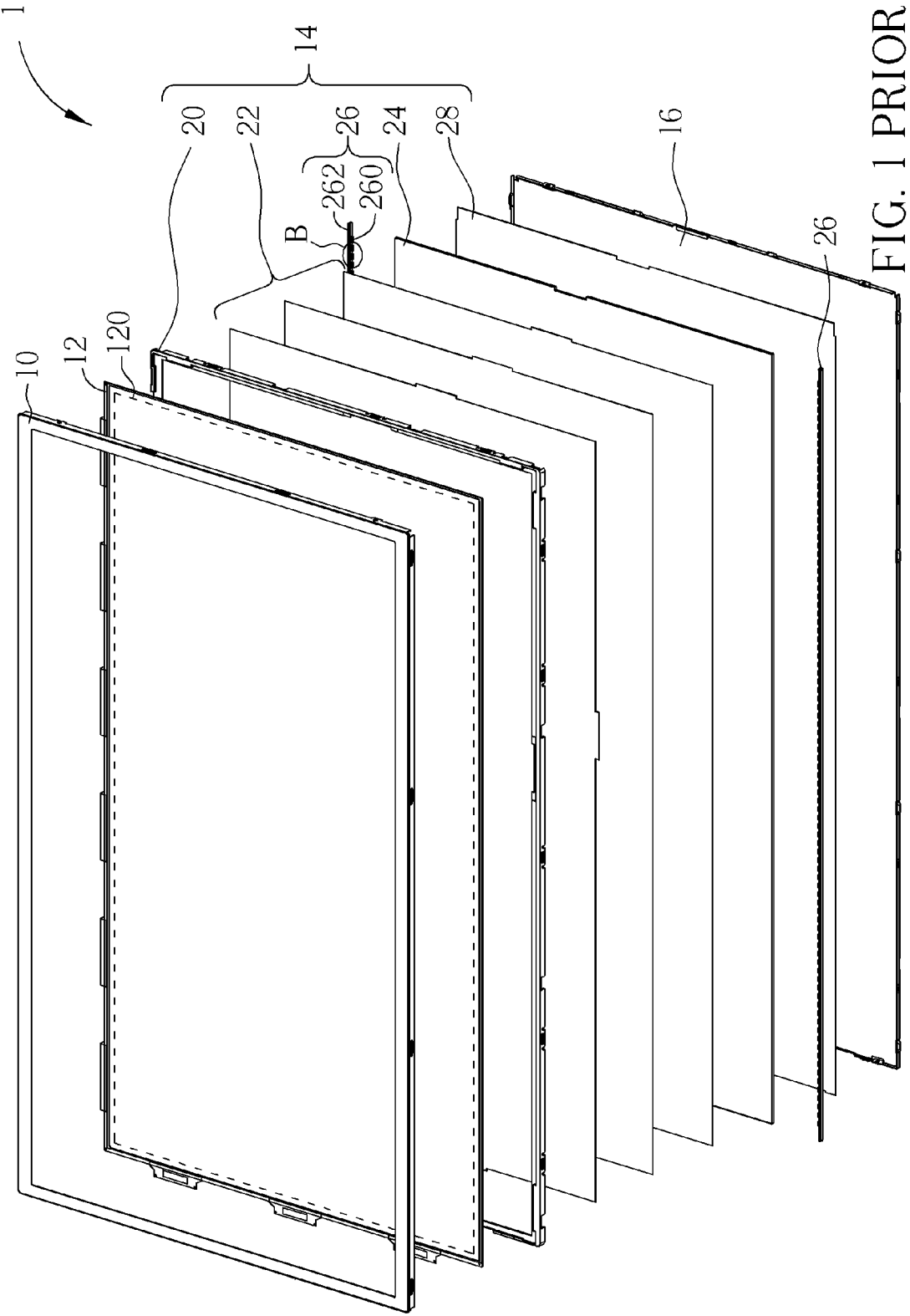
FIG. 1 is an exploded view illustrating an LCD device of the prior art.
Figure 2:
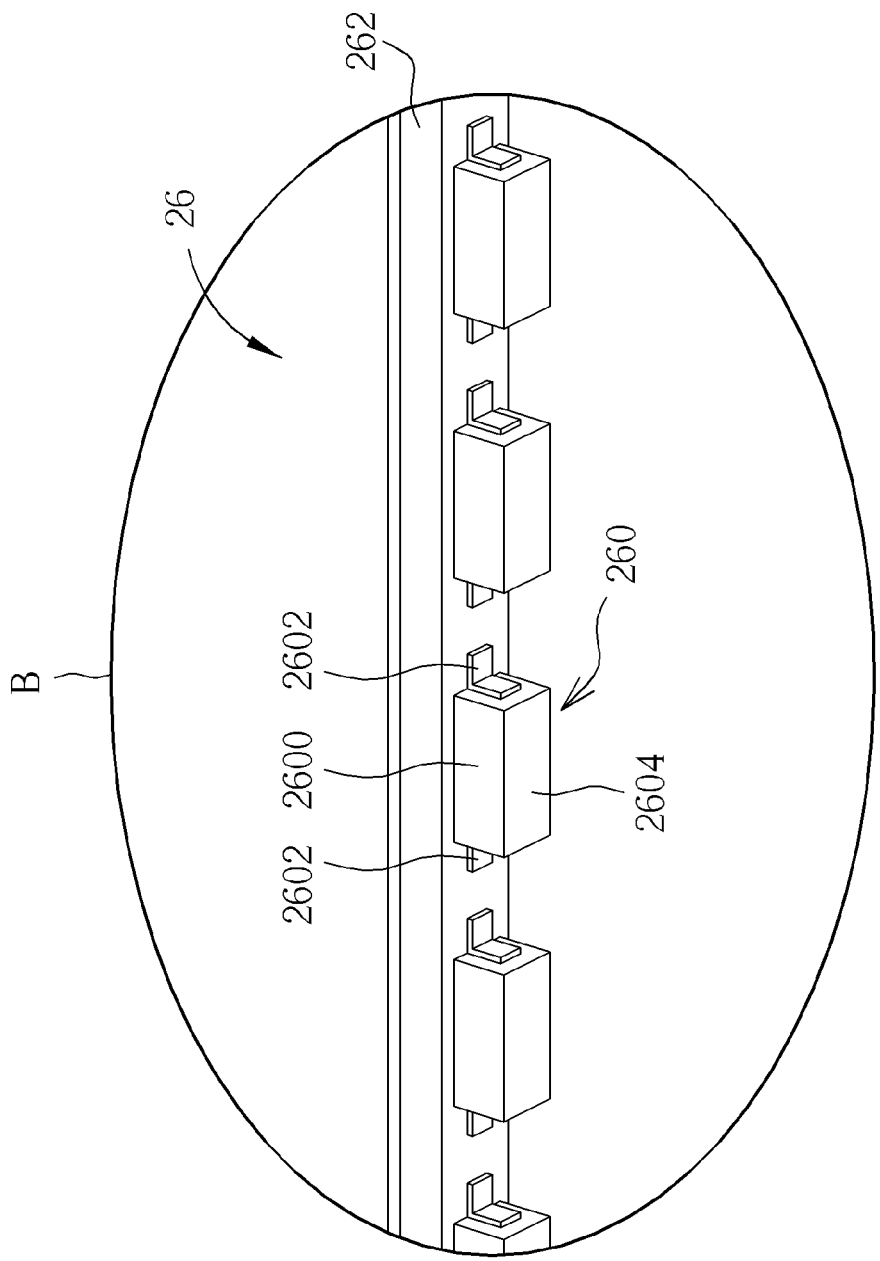
FIG. 2 is an enlarged view illustrating a partial area B shown in FIG. 1.
Figure 3:
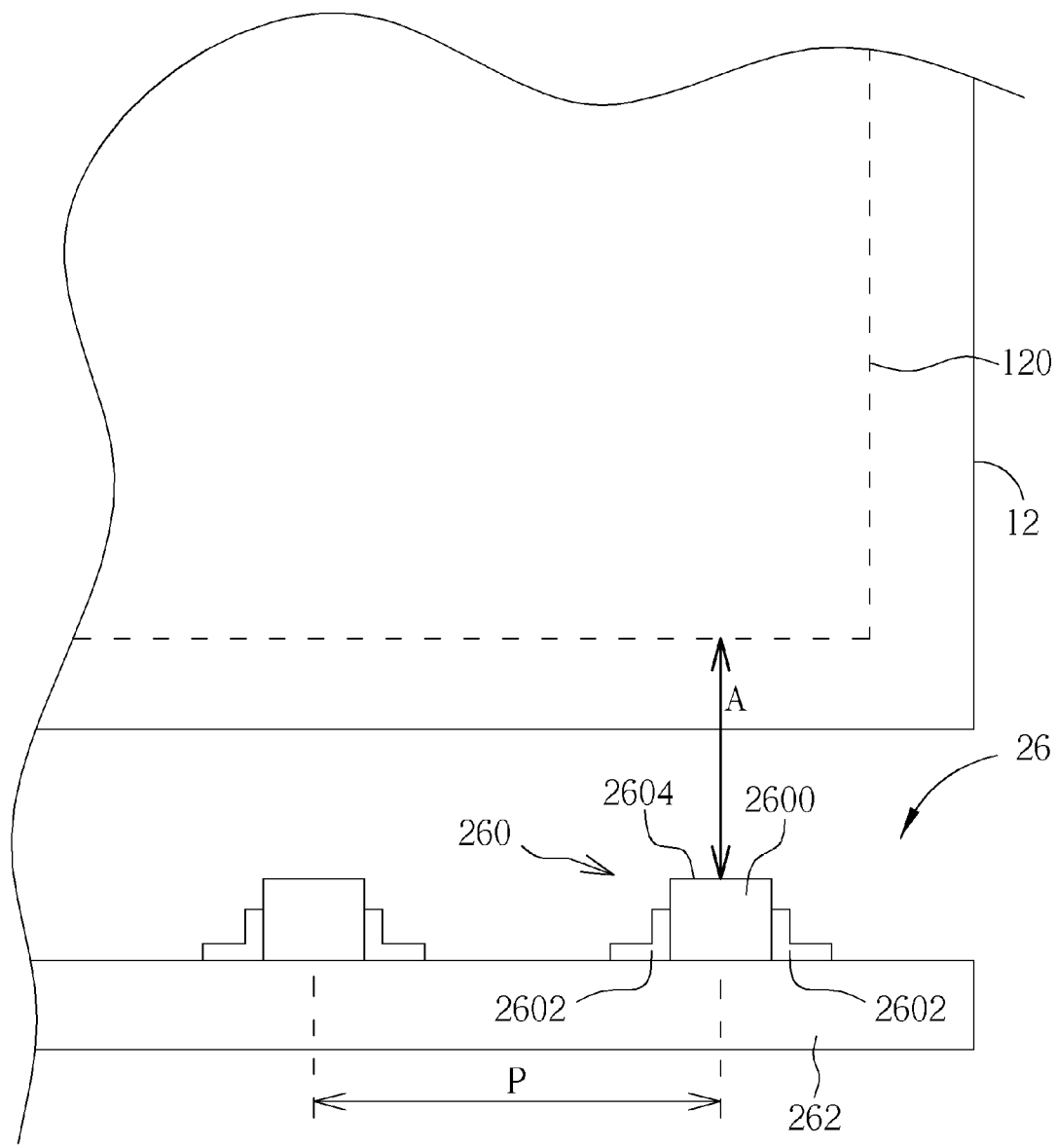
FIG. 3 is a partial top view illustrating the display device and the light bar structure shown in FIG. 1.
Figure 4:
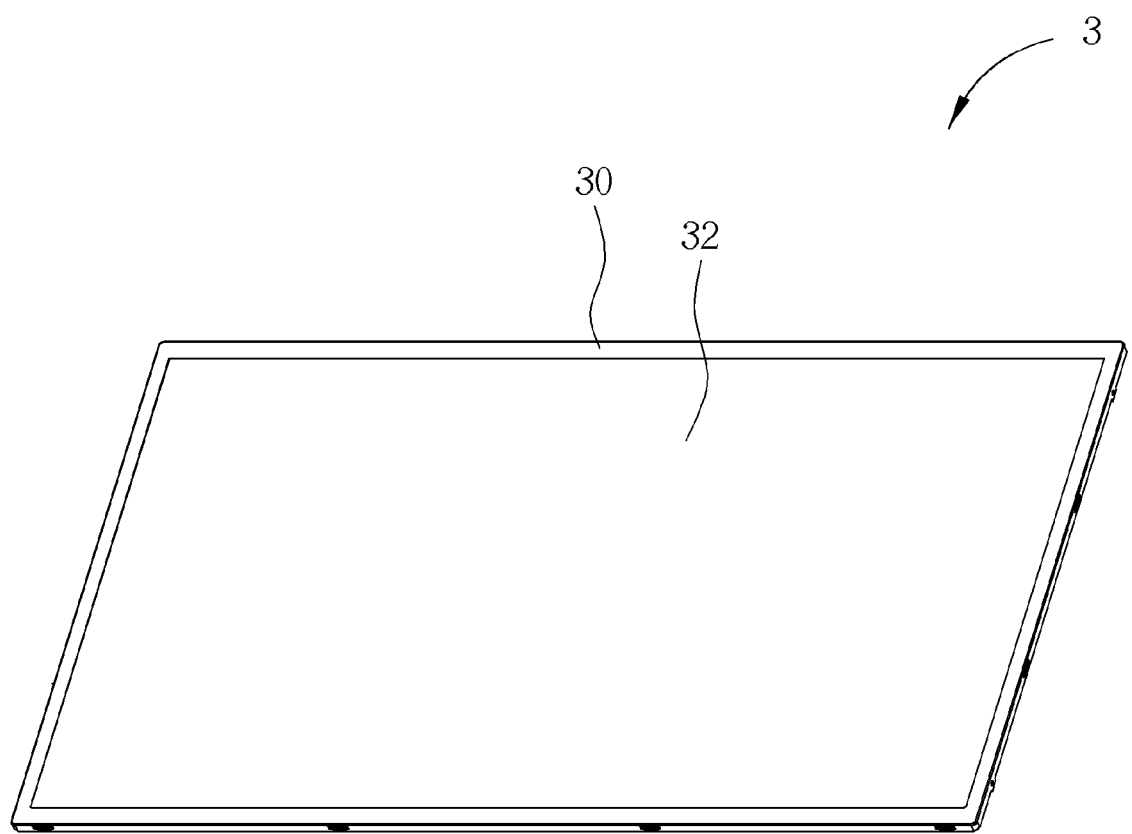
FIG. 4 is a schematic diagram illustrating a display device according to one embodiment of the invention.
Figure 5:
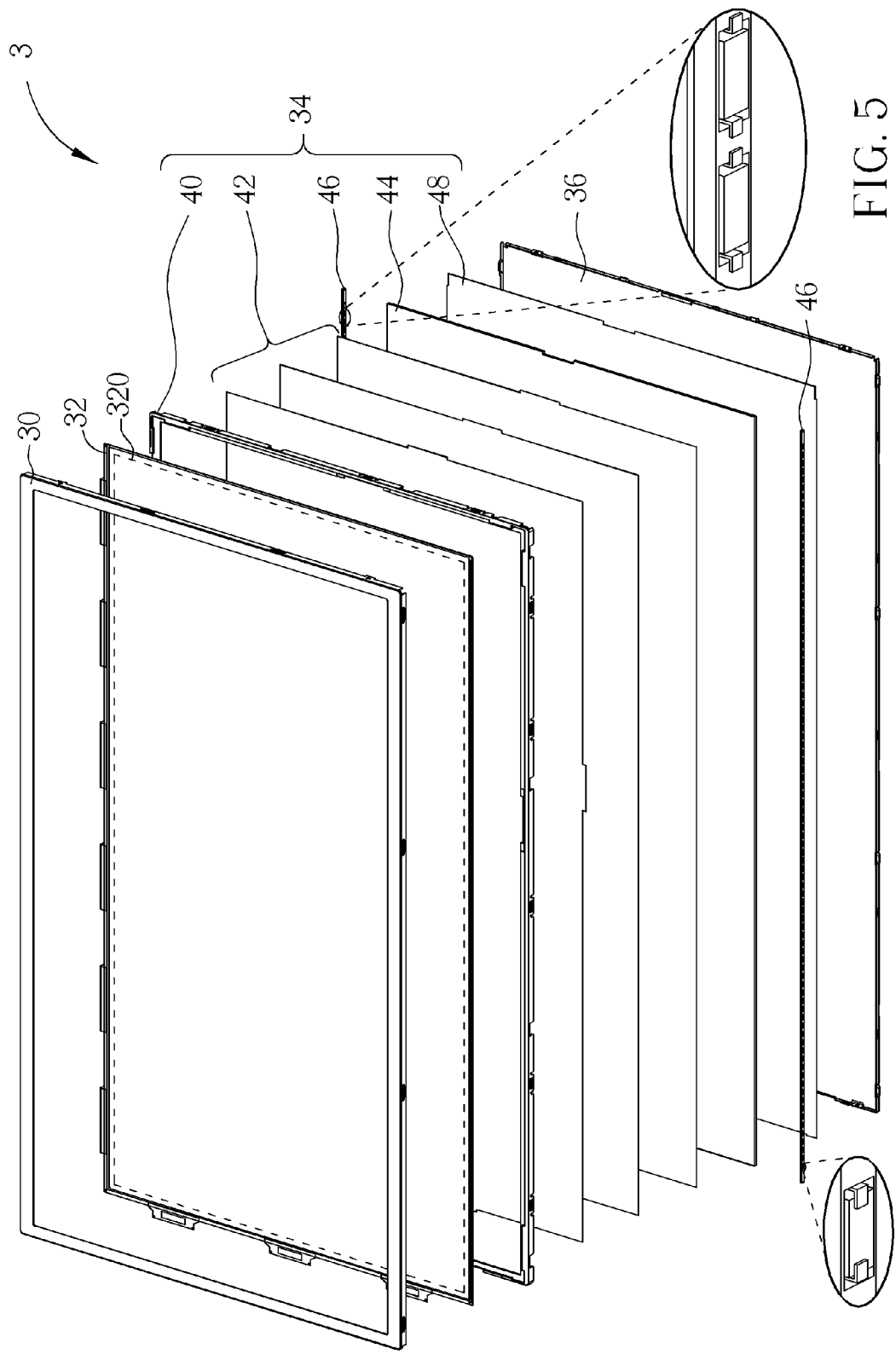
FIG. 5 is an exploded view illustrating the display device shown in FIG. 4.

Referring to FIGS. 4 and 5, FIG. 4 is a schematic diagram illustrating a display device 3 according to one embodiment of the invention, and FIG. 5 is an exploded view illustrating the display device 3 shown in FIG. 4. As shown in FIGS. 4 and 5, the display device 3 comprises an outer frame 30, a display panel 32, a backlight module 34 and a back cover 36. The display panel 32 is disposed on the backlight module 34. In practical applications, the display panel 32 can be, but not limited to, a liquid crystal display panel. Furthermore, the display panel 32 has an active area 320. The backlight module 34 can emit light to the display panel 32, so as to provide sufficient illumination for the display panel 32. The display panel 32 and the backlight module 34 are fixed within the outer frame 30 and the back cover 36, so as to assemble the display device 3.

As shown in FIG. 5, the backlight module 34 comprises a frame 40, an optical film assembly 42, a light guide plate 44, two light bar structures 46 and a reflective sheet 48. The two light bar structures 46 are disposed in the frame 40 and located at opposite sides of the light guide plate 44 respectively. The reflective sheet 48 is disposed in the frame 40 and located under the light guide plate 44. The optical film assembly 42 is disposed in the frame 40 and located on the light guide plate 44. In general, the optical film assembly 42 may comprise at least one diffusion sheet, at least one prism sheet and/or other optical film. It should be noted that the principle of the backlight module 34 and the display panel 32 is well known by one skilled in the art, so it will not be depicted herein.

Figure 6:
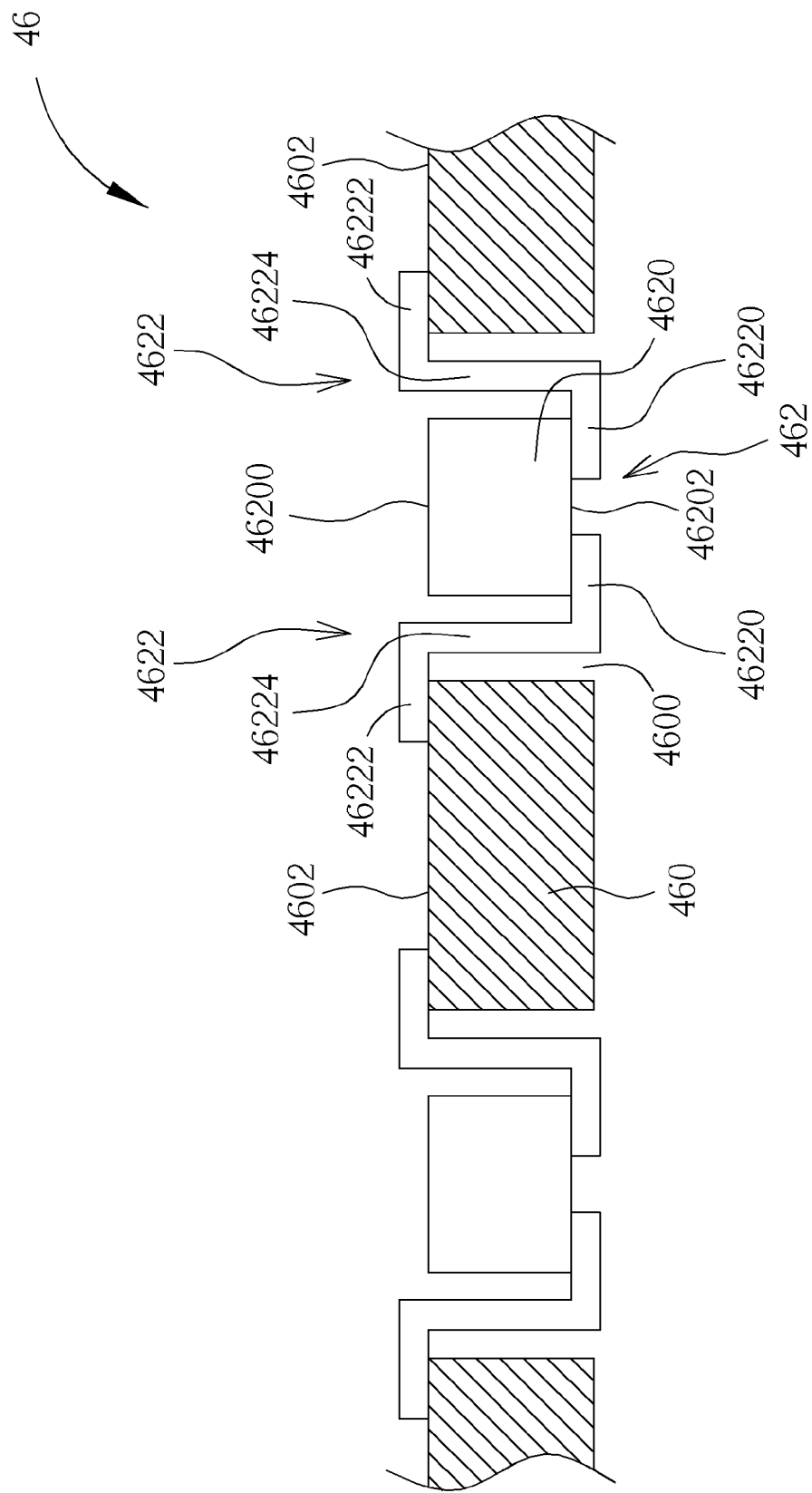
FIG. 6 is a partial sectional view illustrating the light bar structure shown in FIG. 5.

Referring to FIG. 6, FIG. 6 is a partial sectional view illustrating the light bar structure 46 shown in FIG. 5. As shown in FIG. 6, the light bar structure 46 comprises a circuit board 460 and a plurality of light emitting units 462. Each of the light emitting units 462 can be, but not limited to, a light emitting diode. A plurality of holes 4600 are formed on the circuit board 460. Each of the light emitting units 462 comprises a main body 4620 and two leads 4622. The main body 4620 is disposed in one of the holes 4600 and the two leads 4622 are disposed at opposite sides of the main body 4620. The main body 4620 has a light emitting surface 46200 and a non-light emitting surface 46202 opposite to the light emitting surface 46200. The main body 4620 of the light emitting unit 462 emits light via the light emitting surface 46200. Furthermore, each of the leads 4622 has a first connecting portion 46220, a second connecting portion 46222 and an extending portion 46224. The first connecting portion 46220 of each lead 4622 is connected to the non-light emitting surface 46202 of the main body 4620. The extending portion 46224 is extended from the first connecting portion 46220 toward the light emitting surface 46200. The second connecting portion 46222 is extended from the extending portion 46224 and connected to a surface 4602 of the circuit board 460. In this embodiment, each of the leads 4622 can be, but not limited to, Z-shaped.

In practical applications, the light emitting units 462 can be fixed on the circuit board 460 by surface mount technology (SMT). Since the light emitting units 462 are disposed in the holes 4600 of the circuit board 460 respectively, a total thickness of the light bar structure 46 is substantially equal to a thickness of the circuit board 460.

Figure 7:
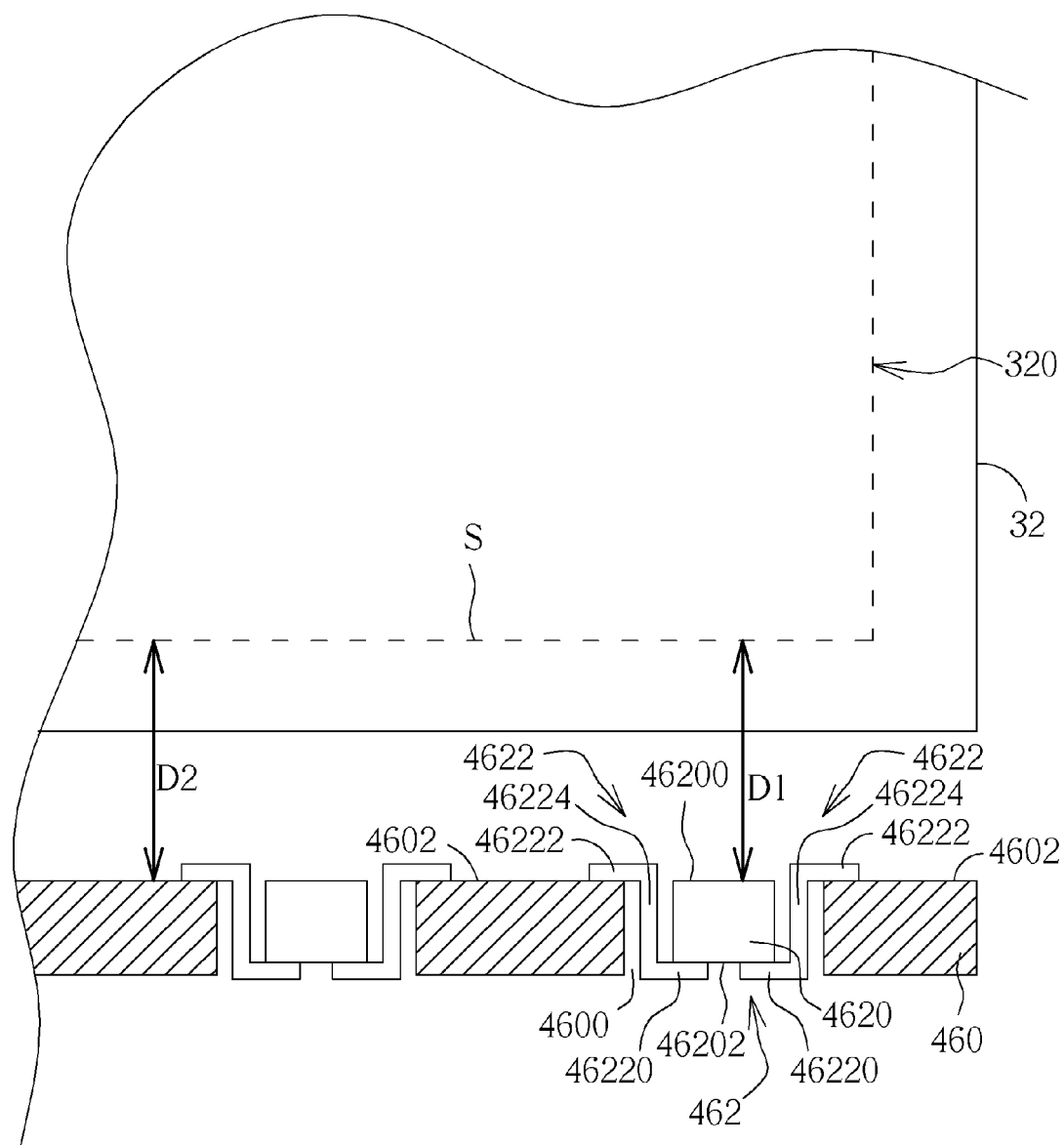
FIG. 7 is a partial top view illustrating the display device and the light bar structure.

Referring to FIG. 7, FIG. 7 is a partial top view illustrating the display device 32 and the light bar structure 46. As shown in FIG. 7, a first distance D1 is between an edge S of the active area 320 of the display panel 32 and the light emitting surface 46200 of the light emitting unit 462, and a second distance D2 is between the edge S of the active area 320 and the surface 4602 of the circuit board 460. Due to the aforesaid structural design of each lead 4622, the main body 4620 of the light emitting unit 462 can be sunk into the corresponding hole 4600 of the circuit board 460, such that the first distance D1 is larger than or equal to the second distance D2. That is to say, the light emitting surface 46200 of the light emitting unit 462 may be lower than the surface 4602 of the circuit board 460, or the light emitting surface 46200 of the light emitting unit 462 and the surface 4602 of the circuit board 460 may be at an identical level. Therefore, the invention can reduce the height of the light bar structure effectively. In other words, the invention can increase the distance between the active area 320 of the display panel 32 and the light emitting surface 46200 of the light emitting unit 462 effectively, so as to prevent the hot spot phenomenon from occurring at the edge S of the active area 320.

Compared to the prior art, the main body of the light emitting unit of the invention is sunk into the corresponding hole of the circuit board due to the structural design of the leads, such that the height of the light bar structure is reduced. Furthermore, since the main body of the light emitting unit is sunk into the corresponding hole of the circuit board, the distance between the light emitting surface of the main body and the active area of the display panel can be increased, so as to prevent the hot spot phenomenon from occurring at an edge of the active area.

Those skilled in the art will readily observe that numerous modifications and alterations of the device and method may be made while retaining the teachings of the invention.

What is claimed is:

1. A light bar structure comprising:
   a circuit board, a plurality of holes being formed on the circuit board; and
   a plurality of light emitting units, each of the light emitting units comprising:
   a main body disposed in one of the holes, the main body having a not fully encapsulated light emitting surface and a non-light emitting surface opposite to the light emitting surface, the light emitting surface of the main body being lower than a surface of the circuit board, or the light emitting surface of the main body and the surface of the circuit board being at an identical level; and
   a plurality of leads, each of the leads being disposed in the one of the holes and having a first connecting portion, a second connecting portion and an extending portion, the first connecting portion being connected to the non-light emitting surface, the extending portion being extended from the first connecting portion toward the light emitting surface, and the second connecting portion being extended from the extending portion and connected to the surface of the circuit board.

2. The light bar structure of claim 1, wherein each of the leads is Z-shaped.

3. The light bar structure of claim 1, wherein each of the light emitting units is a light emitting diode.

4. A display device comprising:
   a display panel; and
   a backlight module comprising:
   a frame, the display panel disposed on the frame;
   a light guide plate disposed in the frame; and a light bar structure disposed in the frame and located at a side of the light guide plate, the light bar structure comprising:
  a circuit board, a plurality of holes being formed on the circuit board; and
  a plurality of light emitting units, each of the light emitting units comprising:
    a main body disposed in one of the holes, the main body having a not fully encapsulated light emitting surface and a non-light emitting surface opposite to the light emitting surface, the light emitting surface of the main body being lower than a surface of the circuit board, or the light emitting surface of the main body and the surface of the circuit board being at an identical level; and
    a plurality of leads, each of the leads being disposed in the one of the holes and having a first connecting portion, a second connecting portion and an extending portion, the first connecting portion being connected to the non-light emitting surface, the extending portion being extended from the first connecting portion toward the light emitting surface, and the second connecting portion being extended from the extending portion and connected to the surface of the circuit board.

5. The display device of claim 4, wherein each of the leads is Z-shaped.

6. The display device of claim 4, wherein each of the light emitting units is a light emitting diode.

7. The display device of claim 4, wherein the display panel has an active area, a first distance is between an edge of the active area and the light emitting surface, a second distance is between the edge of the active area and the surface of the circuit board, and the first distance is larger than or equal to the second distance.

8. The display device of claim 4, wherein the display panel is a liquid crystal display panel.

* * * * *